United States Patent
Hauttecoeur et al.

(10) Patent No.: US 11,610,988 B2
(45) Date of Patent: Mar. 21, 2023

(54) THYRISTOR, TRIAC AND TRANSIENT-VOLTAGE-SUPPRESSION DIODE MANUFACTURING

(71) Applicant: STMicroelectronics (Tours) SAS, Tours (FR)

(72) Inventors: Patrick Hauttecoeur, Saint Cyr sur Loire (FR); Vincent Caro, Chambray les Tours (FR)

(73) Assignee: STMicroelectronics (Tours) SAS, Tours (FR)

( * ) Notice: Subject to any disclaimer, the term of this patent is extended or adjusted under 35 U.S.C. 154(b) by 0 days.

(21) Appl. No.: 17/188,826

(22) Filed: Mar. 1, 2021

(65) Prior Publication Data
US 2021/0280698 A1  Sep. 9, 2021

(30) Foreign Application Priority Data
Mar. 5, 2020  (FR) ...................................... 2002211

(51) Int. Cl.
*H01L 29/747* (2006.01)
*H01L 29/06* (2006.01)
*H01L 29/66* (2006.01)

(52) U.S. Cl.
CPC ........ *H01L 29/747* (2013.01); *H01L 29/0661* (2013.01); *H01L 29/66386* (2013.01)

(58) Field of Classification Search
None
See application file for complete search history.

(56) References Cited

U.S. PATENT DOCUMENTS

| | | | | |
|---|---|---|---|---|
| 4,047,196 A | * | 9/1977 | White | H01L 23/3171 257/586 |
| 4,297,393 A | * | 10/1981 | Denning | C23C 18/28 438/678 |
| 4,978,636 A | * | 12/1990 | Jackson | H01L 23/5329 438/983 |
| 5,119,148 A | * | 6/1992 | Anderson | H01L 29/868 257/656 |
| 5,146,297 A | | 9/1992 | Collins et al. | |
| 2003/0085416 A1 | | 5/2003 | Brogle et al. | |

(Continued)

FOREIGN PATENT DOCUMENTS

| | | | |
|---|---|---|---|
| CN | 108735599 A | | 11/2018 |
| CN | 110828562 A | * | 2/2020 |

(Continued)

OTHER PUBLICATIONS

English translation of "CN 110828562 A" (Year: 2020).*
INPI Search Report and Written Opinion for FR Appl. No. 2002211 dated Nov. 23, 2020 (9 pages).

*Primary Examiner* — Khaja Ahmad
(74) *Attorney, Agent, or Firm* — Crowe & Dunlevy

(57) ABSTRACT

A device includes a semiconductor substrate. A step is formed at a periphery of the semiconductor substrate. A first layer, made of polysilicon doped in oxygen, is deposited on top of and in contact with a first surface of the substrate. This first layer extends at least on a wall and bottom of the step. A second layer, made of glass, is deposited on top of the first layer and the edges of the first layer. The second layer forms a boss between the step and a central area of the device.

32 Claims, 4 Drawing Sheets

(56) References Cited

U.S. PATENT DOCUMENTS

| | | | |
|---|---|---|---|
| 2006/0043379 A1* | 3/2006 | Zhang | H01L 29/8128 257/280 |
| 2007/0001176 A1* | 1/2007 | Ward | H01L 29/1608 257/E29.1 |
| 2013/0334695 A1* | 12/2013 | Tijssen | H01L 23/60 257/773 |

FOREIGN PATENT DOCUMENTS

| | | |
|---|---|---|
| CN | 110828562 A | 2/2020 |
| EP | 0431817 A1 | 6/1991 |

* cited by examiner

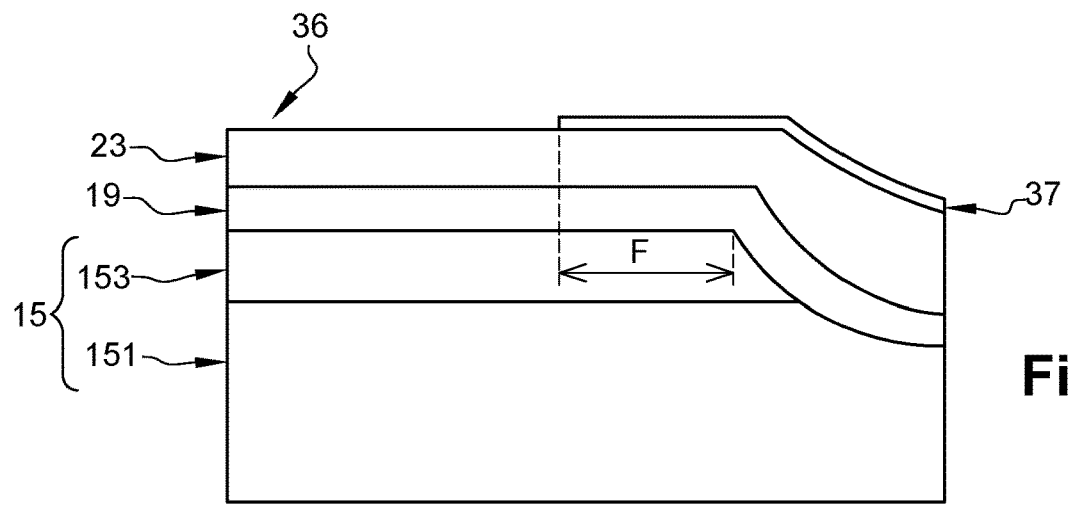
Fig. 6
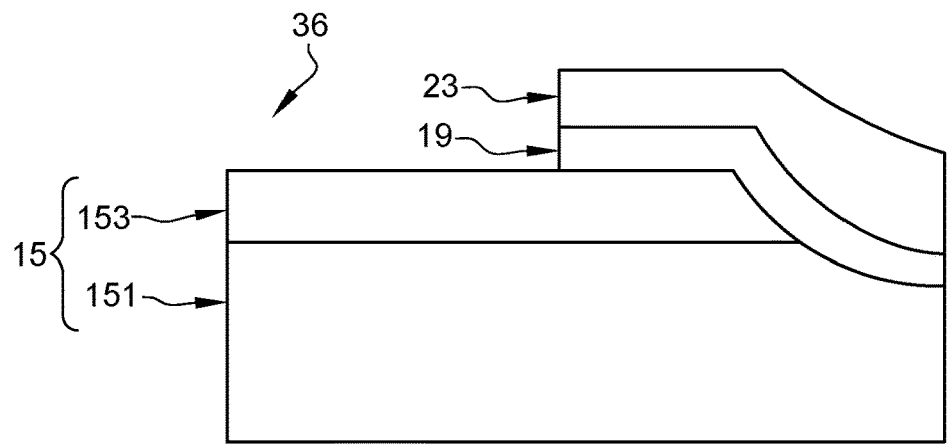
Fig. 7
Fig. 8
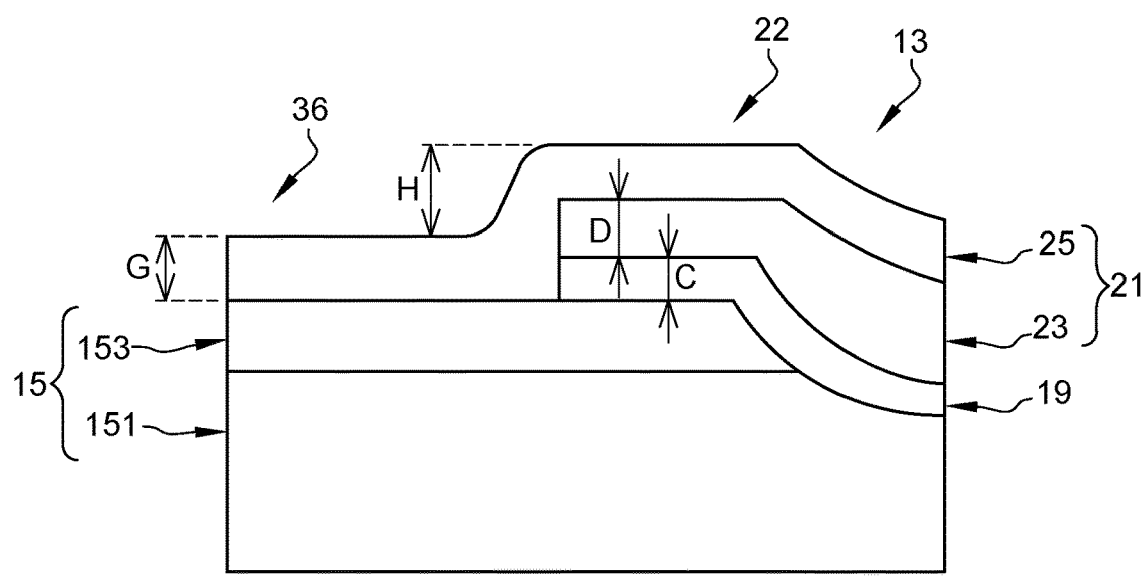

THYRISTOR, TRIAC AND TRANSIENT-VOLTAGE-SUPPRESSION DIODE MANUFACTURING

PRIORITY CLAIM

This application claims the priority benefit of French Application for Patent No. 2002211, filed on Mar. 5, 2020, the content of which is hereby incorporated by reference in its entirety to the maximum extent allowable by law.

TECHNICAL FIELD

The present disclosure generally concerns semiconductor electronic components and more particularly thyristors, triacs and transient-voltage-suppression diodes.

BACKGROUND

Different thyristor manufacturing techniques are known.

There is a need to improve thyristors and their manufacturing methods. More particularly, there is a need to decrease leakage currents in thyristor-type electronic components.

There is a need in the art to overcome all or part of the disadvantages of known thyristors or their manufacturing methods.

SUMMARY

An embodiment provides a device comprising: a semiconductor substrate comprising, at its periphery, a step; a first layer made of polysilicon doped with oxygen on top of and in contact with a first surface of the substrate and extending at least on the walls and the bottom of said step; and a second layer made of glass extending on the first layer and the edges of the first layer, said second layer forming a boss between the step and a central area of the device.

According to an embodiment, the second layer comprises a first glass sub-layer on the first layer and aligned therewith and a second glass sub-layer extending on the first sub-layer and covering the edges of the first layer and the first glass sub-layer.

According to an embodiment: the first glass sub-layer has a thickness, at the level of the boss, in the range from 5 µm to 30 µm, preferably in the range from 10 µm to 20 µm, more preferably equal to approximately 13 µm, more preferably still equal to 13 µm; and/or the first sub-layer has a thickness, at the bottom of the step, in the range from 20 µm to 60 µm, preferably in the range from 30 µm to 40 µm, more preferably equal to approximately 35 µm, more preferably still equal to 35 µm.

According to an embodiment, the second glass sub-layer has a thickness in the range from 5 µm to 20 µm, preferably equal to approximately 13 µm, more preferably equal to 13 µm.

According to an embodiment, the first layer has a thickness in the range from 0.2 µm to 1 µm, preferably equal to approximately 0.5 µm, more preferably equal to 0.5 µm.

According to an embodiment, the boss has a thickness in the range from 10 µm to 50 µm, preferably in the range from 10 µm to 35 µm, more preferably equal to approximately 15 µm, for example, equal to 15 µm.

According to an embodiment, the step has a depth in the range from 80 µm to 200 µm, preferably equal to approximately 105 µm, more preferably equal to 105 µm.

An embodiment provides an electronic component comprising the device on each surface of the substrate to form a thyristor, a triac or a transient-voltage-suppression diode.

An embodiment provides a method, comprising, among others, the steps of: forming a step at the periphery of the substrate; forming a first layer made of polysilicon doped with oxygen doped on top of and in contact with a first surface of the substrate, the first layer extending at least on the walls and the bottom of said step; and forming a second glass layer extending on the first layer and the edges of the first layer to form, between the step and the central portion of the device, a boss.

According to an embodiment, the forming of the second layer comprises the steps of: forming, on the first layer, a first glass sub-layer; carrying out a first wet etching of the first layer and of the first glass sub-layer along the pattern of a first resin mask formed by photolithography; forming a second glass sub-layer on the first glass sub-layer so that the second glass sub-layer covers the first glass sub-layer and the edges of the first layer and of the first glass sub-layer, to form the boss at the inner periphery of the step; and carrying out a second wet etching of the second glass sub-layer along the pattern of a second resin mask formed by photolithography.

According to an embodiment the first etchings is carried out in a bath, made of approximately 59% of ammonium fluoride, approximately 6% of hydrogen fluoride, and approximately 35% of hydrogen peroxide.

According to an embodiment the second etching is carried out in a bath, made of approximately 50% of hydrogen fluoride, and approximately 50% of hydrochloric acid.

According to an embodiment the first and second etchings are carried out in baths having a temperature in the range from eighteen degrees Celsius to thirty degrees Celsius, preferably from twenty degrees Celsius to twenty-five degrees Celsius, more preferably equal to approximately twenty-two degrees Celsius, more preferably still equal to twenty-two degrees Celsius.

According to an embodiment the first etching has a duration in the range from thirty minutes to sixty minutes, preferably in the range from forty minutes to fifty minutes, more preferably equal to approximately forty-six minutes, more preferably still equal to forty-six minutes.

According to an embodiment the second etching has a duration in the range from one minute to two minutes, preferably in the range from one minute and fifteen seconds to one minute and forty seconds, more preferably equal to approximately one minute and thirty seconds, more preferably still equal to one minute and thirty seconds.

According to an embodiment the first layer is deposited by low-pressure chemical vapor deposition or by plasma enhanced chemical vapor deposition.

BRIEF DESCRIPTION OF THE DRAWINGS

The foregoing and other features and advantages will be discussed in detail in the following non-limiting description of specific embodiments in connection with the accompanying drawings.

FIG. 6 shows, in a partial simplified cross-section view, another step of an implementation mode of a method of manufacturing the component illustrated in FIG. 1;

FIG. 7 shows, in a partial simplified cross-section view, another step of an implementation mode of a method of manufacturing the component illustrated in FIG. 1;

FIG. 8 shows, in a partial simplified cross-section view, another step of an implementation mode of a method of manufacturing the component illustrated in FIG. 1;

DETAILED DESCRIPTION

Figure 1:
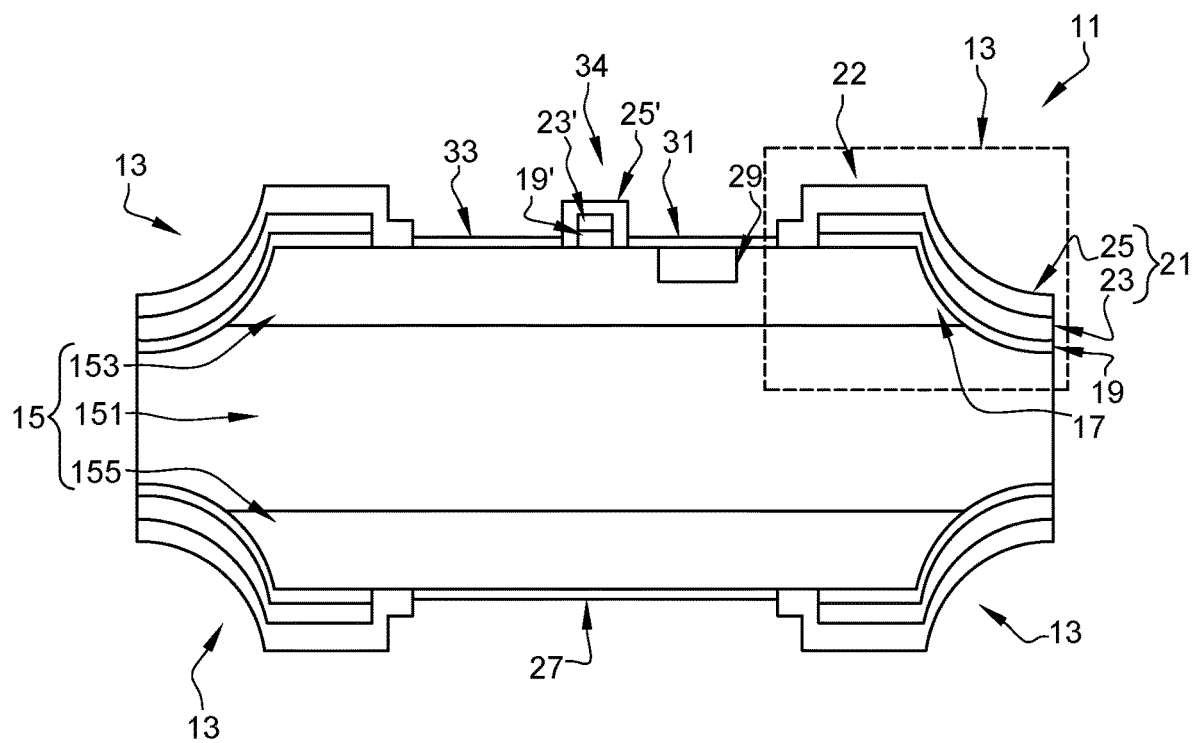
FIG. 1 shows in a partial simplified cross-section view an embodiment of a thyristor-type electronic component.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed. In particular, the first steps of the manufacturing of a thyristor have not been detailed, only the steps of protection against current leakages being described.

Throughout the present disclosure, the term "connected" is used to designate a direct electrical connection between circuit elements, whereas the term "coupled" is used to designate an electrical connection between circuit elements that may be direct, or may be via one or more other elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings.

The terms "about", "approximately", "substantially", and "in the order of" are used herein to designate a tolerance of plus or minus 10%, preferably of plus or minus 5%, of the value in question.

FIG. 1 shows, in a partial simplified cross-section view, an embodiment of a thyristor-type electronic component.

More particularly, FIG. 1 illustrates a high-voltage electronic component 11, for example, a thyristor having a turn-on voltage greater than approximately 1,200V.

In the following description, the upper surface of the structure is considered, in the orientation of FIG. 1, as being the front side and the lower surface of the structure, in the orientation of FIG. 1, as being the back side.

The electronic component 11 illustrated in FIG. 1 has, for example, in top view, the shape of a squircle (square with rounded angles), of a rectangle with rounded angles, or of a circle.

Component 11 comprises, for example, on each of the edges of its upper and lower surfaces, a first stack or device 13. More particularly, component 11 comprises a stack 13 on the edge(s) of its lower surface and an identical stack 13 on the edge(s) of its upper surface.

A stack or device 13 comprises: a semiconductor substrate 15 comprising, at its periphery, a step 17; a first layer 19 made of polysilicon doped with oxygen or SIPOS, on top of and in contact with a first surface of substrate 15 and extending at least on the walls and the bottom of step 17; and a second layer 21 made of glass, extending on first layer 19 and the edges of first layer 19 and forming, at the inner periphery of step 17, an over thickness or boss 22.

SIPOS corresponds to a polysilicon doped with oxygen, that is, silicon which generally has an oxygen concentration greater than approximately 10%. The oxygen concentration of the SIPOS in the present description is preferably in the range from 20% to 60% and is more preferably in the order of 40%.

Second layer 21, for example, comprises two sub-layers:
a first glass sub-layer 23, on top of and in contact with first layer 19 and aligned therewith; and
a second glass sub-layer 25 extending on first glass sub-layer 23 and covering the edges of first layer 19 and of first glass sub-layer 23.

According to the embodiment illustrated in FIG. 1, second glass sub-layer 25 further covers a portion of substrate 15 which is not covered with the first layer 19.

In the case of a component having a stack 13 on its two surfaces, substrate 15 is common to the two stacks.

In the embodiment of FIG. 1, component 11 further comprises: a first electrode 27 on the back side of substrate 15, at the center of component 11, so that first electrode 27 is surrounded with second glass sub-layer 25; a doped buried area 29, on the upper surface side of substrate 15 and flush with this same surface, where area 29 is not centered on the upper surface, and is preferably located closer to stack 13 than the center of the structure, for example, on the right-hand side (in the orientation of FIG. 1) on the upper surface of substrate 15; a second electrode 31, on the front side of the substrate and vertically in line with area 29, said second electrode 31 extending on the right-hand side (in the orientation of FIG. 1) toward the second sub-layer 25 of stack 13 and all the way thereto; a third electrode 33 on the front side of substrate 15, on a portion of said surface of substrate 15 which is not covered with second electrode 31, said third electrode 33 being, for example, on the left-hand side (in the orientation of FIG. 1), on the upper surface of substrate 15 and extending, on the left-hand side (in the orientation of FIG. 1), all the way to second glass sub-layer 25, while electrode 33 and electrode 31 do not touch each other; and a second stack between the second electrode 31 and the third electrode 33.

According to the embodiment illustrated in FIG. 1, substrate 15 comprises a first central portion 151 of a material of a first conductivity type n. Substrate 15 comprises a second portion 153, located on the upper surface of first portion 151 of substrate 15, of a material of a second conductivity type p. Substrate 15 further comprises a third portion 155, located on the lower surface of substrate 15, made of a material of second conductivity type p. The materials of the second 153 and third 155 portions of substrate 15 may have a substantially identical composition, an identical composition, or a different composition.

Area 29 is, for example, made of a heavily-doped material of first conductivity type n (more heavily-doped than portion 153).

A stack 34 is provided on the substrate 15 front side and comprises: a part 19' of the first layer 19, on top of and in contact with the substrate 15 front side, where the lateral edges do not touch the electrodes 31 and 33; a part 23' of the sub-layer 23, on top and in contact with the part 19' front side; and a part 25' of the sub-layer 25 on top of and in contact with the part 23' front side, where the part 25' of the sub-layer 25 covers lateral edges of the part 23' of the sub-layer 23 and lateral edges of the part 19' of the layer 19.

Component 11 is thus formed of four alternately n and p doped layers 155, 151, 153, and 29, which define a thyristor.

The thyristor anode is electrode 27, in contact with portion 155 of substrate 15. The thyristor cathode is electrode 31, in contact with area 29, and the gate is electrode 33, in contact with portion 153 of substrate 15.

Figure 2:
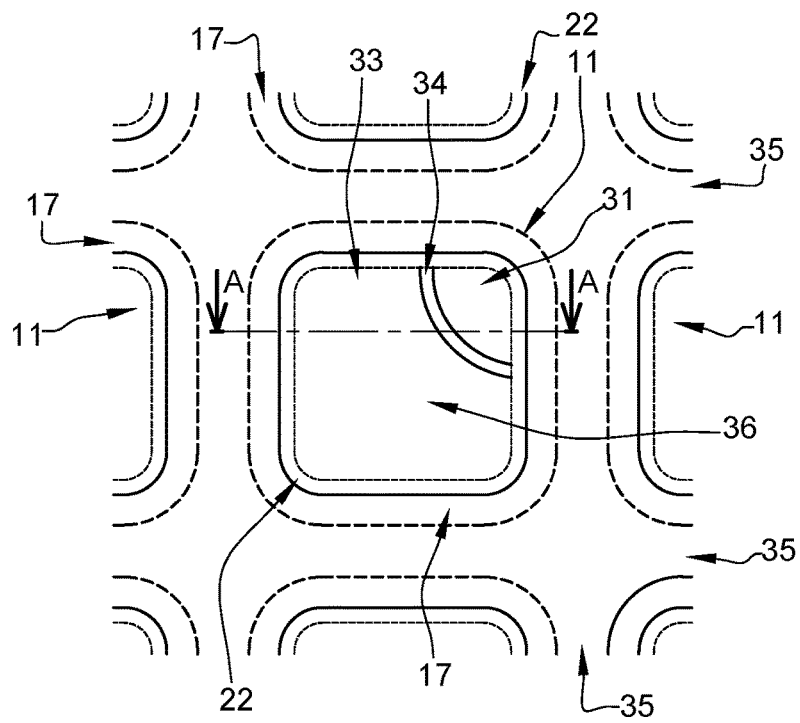
FIG. 2 shows in a partial simplified top view an electronic component wafer.

FIG. 2 shows in a partial simplified top view an electronic component wafer.

More particularly, FIG. 2 shows a wafer or wafer portion having a plurality of components 11 formed thereon. FIG. 1 is a cross-section view along cross-section plane AA of FIG. 2.

Components 11 are generally manufactured in wafers. In other words, a plurality of components 11 is simultaneously manufactured on a same semiconductor wafer, for example, made of silicon. Components 11 are, at the end of the manufacturing process, individualized.

FIG. 2 shows a plurality of components 11 (an entire component and eight partially shown components), each having a peripheral portion and a central portion 36. The peripheral portion of each component 11 is formed of stack 13 which comprises a step 17 and a boss 22 at the border of said step 17.

The central portion 36 front side of each component 11 comprises, as shown in FIG. 2, the electrode 31 on one of the corners or on one of the edges of the component 11 and the electrode 33. Electrode 31 and electrode 33 are separated by the stack 34. Stack 34 extending from one edge of component 11 to another edge. Stack 34 takes, for example, the shape of a circle arc.

The different components 11 are individualized, by cutting, for example, by sawing, along sawing paths 35.

FIGS. 3 to 10 schematically and partially illustrate successive steps of an implementation mode of a method of manufacturing the electronic component 11 illustrated in FIG. 1. More particularly, FIGS. 3 to 10 schematically and partially illustrate successive steps of an embodiment of a method of manufacturing stack 13.

To simplify the description, unless otherwise specified, a manufacturing step is designated in the same way as the structure obtained at the end of the step.

Figure 3:
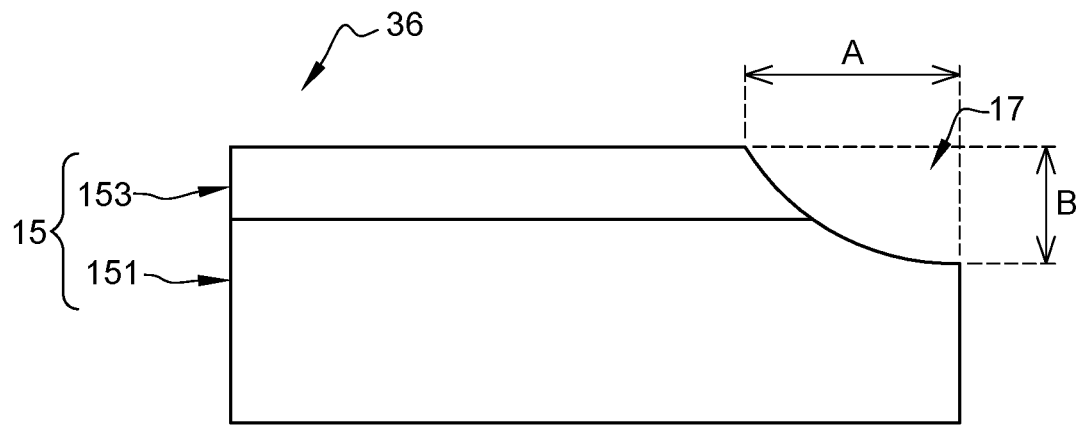
FIG. 3 shows, in a partial simplified cross-section view, a step of an implementation mode of a method of manufacturing the component illustrated in FIG. 1.

FIG. 3 shows, in a partial simplified section view, a step of an implementation mode of a method of manufacturing the component illustrated in FIG. 1.

More particularly, FIG. 3 shows a structure comprising the substrate 15 having step 17 formed therein. Step 17 has a width A and a depth B.

Steps 17 are, for example, formed at the level of the wafer by non-through partial sawing or by wet etching along a grid pattern between locations of the future thyristors. The sawing lines form grooves which subsequently define sawing paths 35.

The sawing paths 35 of individualization of components 11 (FIG. 2) are preferably formed with a blade which is thinner than the blade enabling to form the grooves of steps 17.

Width A of the step is, for example, in the range from 200 μm to 400 μm, preferably in the range from 250 μm to 350 μm. Width A is more preferably equal to 300 μm.

Depth B of step 17 is, for example, in the range from 80 μm to 200 μm, preferably equal to approximately 105 μm. Depth B is more preferably equal to 105 μm.

Thus, with a wafer having a thickness, for example, from 300 μm to 400 μm, the residual thickness of the edges of the substrates of components 11 is, for example, in the range from 90 μm to 200 μm.

Figure 4:
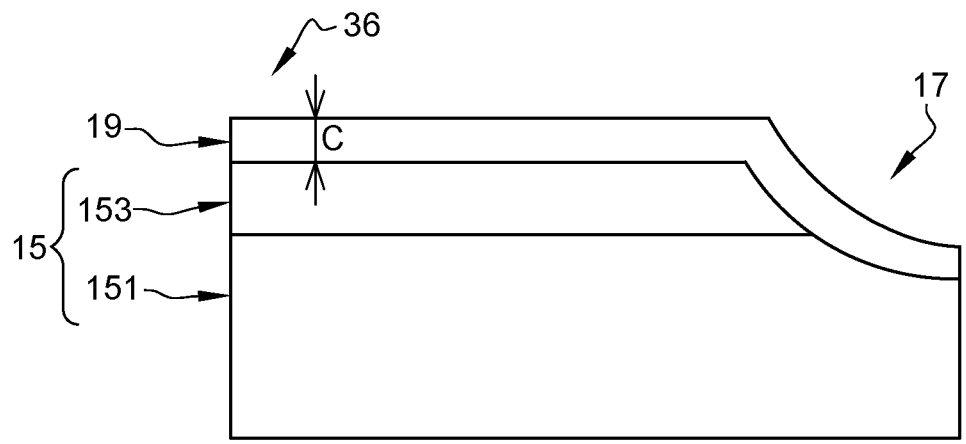
FIG. 4 shows, in a partial simplified cross-section view, another step of an implementation mode of a method of manufacturing the component illustrated in FIG. 1.

FIG. 4 shows in a partial simplified section view another step of an implementation mode of a method of manufacturing the component illustrated in FIG. 1.

More particularly, FIG. 4 illustrates a step of depositing first SIPOS layer 19 on and in contact with the front side of the structure illustrated in FIG. 3.

Layer 19 is deposited over the entire structure (full plate), that is, it is deposited on and in contact with the upper surface of substrate 15 and on and in contact with the edges and the bottom of step 17. Layer 19 has a substantially constant thickness C over the entire surface. In this context, it will be noted that the formation of step 17 may not produce discrete surfaces that are edges and bottoms, it being understood here that deposition on the edges and bottoms means deposition on the surface(s) which are defined by the non-through partial sawing or by wet etching performed in FIG. 3.

Thickness C of first layer 19 is, for example, in the range from 0.2 μm to 1 μm, preferably equal to approximately 0.5 μm. Thickness C is more preferably equal to 0.5 μm.

The deposition of layer 19 is performed by low-pressure chemical vapor deposition (LPCVD) or by plasma-enhanced chemical vapor deposition (PECVD).

Figure 5:
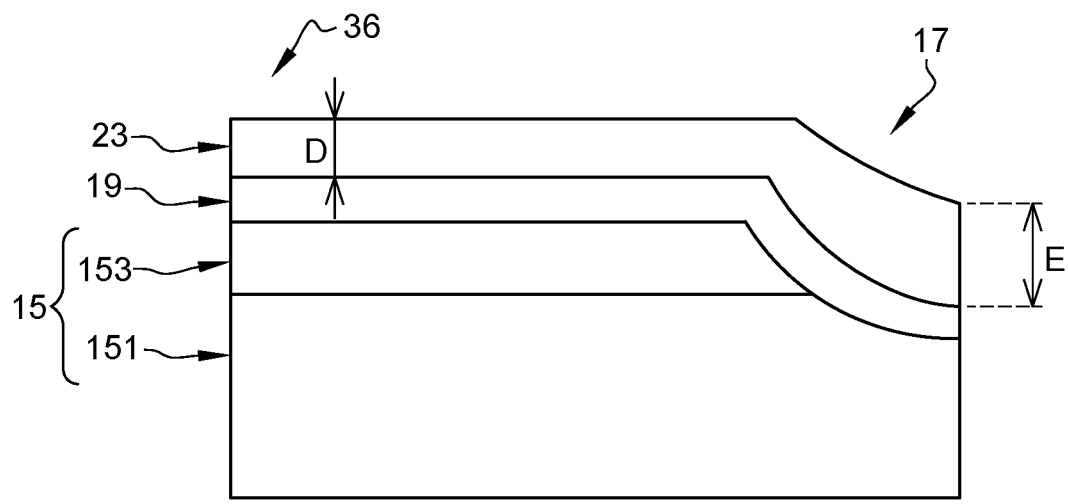
FIG. 5 shows, in a partial simplified cross-section view, another step of an implementation mode of a method of manufacturing the component illustrated in FIG. 1.

FIG. 5 shows in a partial simplified section view another step of an implementation mode of a method of manufacturing the component illustrated in FIG. 1.

More particularly, FIG. 5 illustrates a step of depositing the first sub-layer 23 of second layer 21 (FIG. 1) on and in contact with the front surface of the structure obtained at the end of the steps of FIGS. 3 and 4.

Sub-layer 23 is deposited full plate. It thus covers the entire layer 19, in step 17 and in line with step 17, at the level of central portion 36. Sub-layer 23 is, for example, deposited by spin coating on and in contact with the front surface of layer 19. As a result, sub-layer 23 thickness is not constant but is greater at the bottom of steps 17 (in the grooves of the wafer between components 11) than at their top and in central portions 36.

Thickness D, in central portion 36, is thus smaller than thickness E at the bottom of step 17.

Thickness D of first sub-layer 23, in central portion 36 is, for example, in the range from 5 μm to 30 μm, preferably in the range from 10 μm to 20 μm. Thickness D is more preferably equal to approximately 13 μm, more preferably still equal to 13 μm.

Thickness E of first sub-layer 23, at the bottom of step 17 is, for example, in the range from 20 μm to 60 μm, preferably in the range from 30 μm to 40 μm. Thickness E is more preferably equal to 35 μm, more preferably still equal to 35 μm.

The thickness difference between portion 36 and the bottom of step 17 enables to attenuate the angle (to open the angle) present at the top of step 17.

Sub-layer 23 is, for example, made of glass.

FIG. 6 shows in a partial simplified section view another step of an implementation mode of a method of manufacturing the component illustrated in FIG. 1.

More particularly, FIG. 6 illustrates a step of deposition and photolithography of a third layer 37 of a first resin on the front side of the structure obtained at the end of the steps of FIGS. 3 to 5.

In the present embodiment, first sub-layer 23 is covered with third layer 37. Third layer 37 is deposited by spin coating to cover first sub-layer 23.

Layer 37 is then submitted to a photolithography, that is, layer 37 is exposed to UV rays through a first mask and then developed in a solvent.

According to an embodiment, first resin is a positive resin, i.e., the portion of the resin exposed to UV rays becomes soluble in a solvent.

According to another embodiment, first resin is a negative resin, i.e., the portion of the resin exposed to UV rays becomes insoluble in a solvent.

Layer 37 extends, at the end of the lithography step, into steps 17 and, in the direction of central portion 36, over a distance F. Distance F corresponds to the substrate surface and the lateral edge, directed towards central portion 36, of layer 37.

Distance F is, for example, in the range from 5 µm to 15 µm, preferably in the range from 6 µm to 14 µm. Distance F is more preferably equal to 10 µm.

Layer 37 is, at the next step, used as a mask for a first etching of the underlying layers, that is, of layers 19 and 23.

FIG. 7 shows in a partial simplified top view another step of an implementation mode of a method of manufacturing the component illustrated in FIG. 1.

More particularly, FIG. 7 illustrates a step of wet etching of first layer 19 and of first sub-layer 23 from the structure obtained at the end of the steps of FIGS. 3 to 6.

The portions of layers 23 and 19 which are not topped with layer 37 are removed by etching.

The first etching is performed in a bath, made of approximately 59% (volumetric) of ammonium fluoride (that is, approximately ten volumes), of approximately 6% of hydrogen fluoride (that is, approximately one volume), and approximately 35% of hydrogen peroxide (that is, approximately six volumes).

The first etching is carried out in a bath having a temperature between eighteen degrees Celsius and thirty degrees Celsius, preferably in the range from twenty degrees Celsius and twenty-five degrees Celsius. The first etching is carried out in a bath having a temperature for example equal to twenty-two degrees Celsius.

The first etching has a duration in the range from thirty minutes to sixty minutes, preferably in the range from forty minutes to fifty minutes. The duration of the first etching is more preferably equal to approximately forty-six minutes, more preferably equal to forty-six minutes.

During this step, layer 37 is removed. At the end of the step illustrated in FIG. 7, the structure thus no longer comprises layer 37.

FIG. 8 shows in a partial simplified section view another step of an implementation mode of a method of manufacturing the component illustrated in FIG. 1.

More particularly, FIG. 8 illustrates a step of deposition of the second sub-layer 25 of second layer 21 on and in contact with the front side of the structure obtained at the end of the steps of FIGS. 3 to 7. Second sub-layer 25 enables to fill possible holes which have formed in first sub-layer 23 during the deposition thereof. The second sub-layer 25 enables, with first sub-layer 23, to encapsulate first layer 19.

During this step, second sub-layer 25 is deposited full plate and thus covers the front surface of first sub-layer 23 and a portion of substrate 15 which not covered with layer 19. Sub-layer 25 is, for example, deposited by spin coating on and in contact with the front side of the structure. Sub-layer 25, similarly to sub-layer 23, does not have a constant thickness but has a greater thickness at the bottom of steps 17 than at the top of steps 17. This phenomenon is however lighter in the case of sub-layer 25 since the average thickness of sub-layer 25 is smaller than the thickness of sub-layer 23.

Sub-layer 25 is deposited with a thickness G, measured on the portion of the substrate which is not covered with layer 19, that is, in central portion 36. Sub-layer 25 forms vertically in line with sub-layer 23 a boss 22 having its height H depending on the respective thicknesses C, D, and G of layers 19, 23, and 25.

Thickness G of second sub-layer 25 is in the range from 5 µm to 20 µm. Thickness G is preferably equal to approximately 13 µm, more preferably equal to 13 µm.

Thickness H of boss 22 is in the range from 10 µm to 50 µm, preferably in the range from 10 µm to 35 µm. Thickness H is more preferably equal to approximately 15 µm, more preferably still equal to 15 µm.

Second sub-layer 25 is, for example, made of glass.

Figure 9:
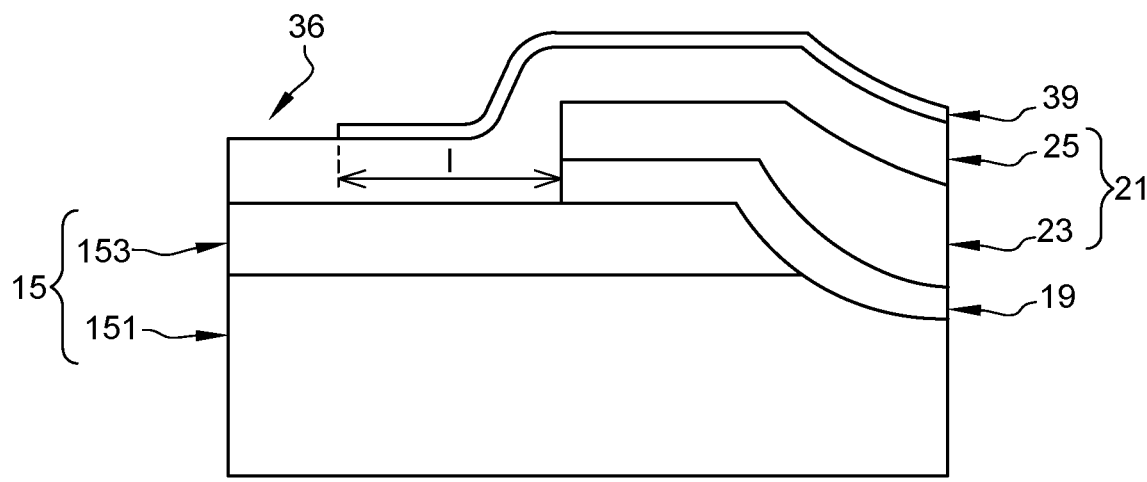
FIG. 9 shows, in a partial simplified cross-section view, another step of an implementation mode of a method of manufacturing the component illustrated in FIG. 1.

FIG. 9 shows, in a partial simplified section view, another step of an implementation mode of a method of manufacturing the component illustrated in FIG. 1.

More particularly, FIG. 9 illustrates a step of deposition of a fourth layer 39 of a second resin on the front side of the structure obtained at the end of the steps of FIGS. 3 to 8, followed by a photolithography thereof.

During this step, fourth layer 39 is deposited full plate, thus covering the front surface of sub-layer 25. Layer 39 is for example deposited by spin coating on the front side of the structure.

Layer 39 is then submitted to a photolithography, that is, layer 39 is exposed to UV rays through a second mask, after which it is developed in a solvent.

According to an embodiment, the second resin is a positive resin.

According to another embodiment, the second resin is a negative resin.

Layer 39 extends, at the end of the lithography step, on layers 19 and 23 and, beyond layers 19 and 23, towards central portion 36 of component 11 over a distance I. Distance I corresponds to the distance between the lateral edge of layer 39 and the lateral edge of layers 19 and 23.

Distance I is in the range from 5 µm to 20 µm, preferably equal to approximately 10 µm. Distance I is more preferably equal to 10 µm.

At the end of the photolithography step, layer 39 is no longer present in central portion 36. Layer 39 is, in the following step, used as a mask for a second etching of the underlying layer, that is, of layer 25.

Figure 10:
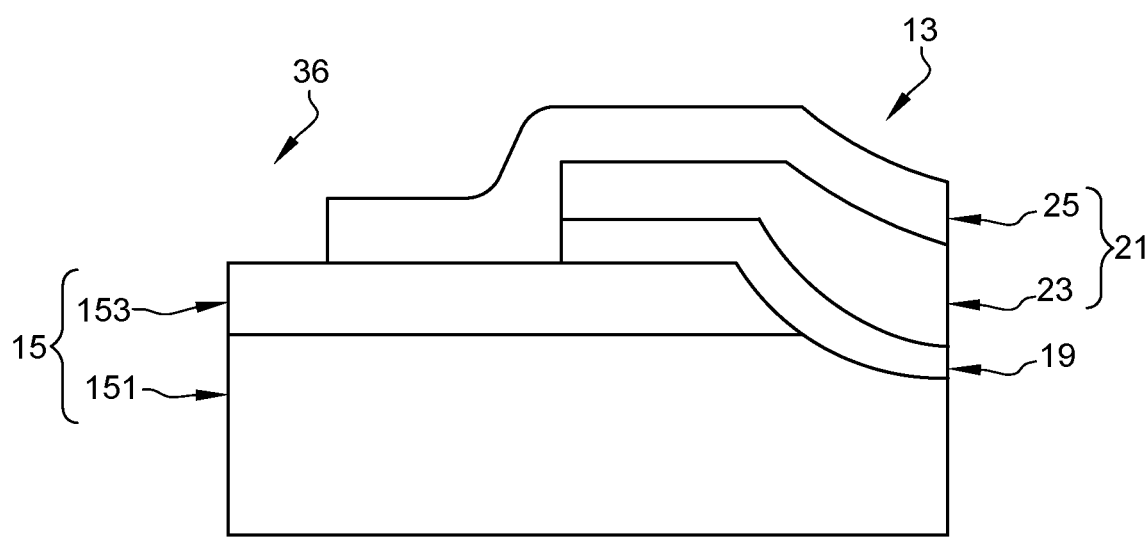
FIG. 10 shows in a partial simplified cross-section view another step of an implementation mode of a method of manufacturing the component illustrated in FIG. 1.

FIG. 10 shows in a partial simplified section view another step of an implementation mode of a method of manufacturing the component illustrated in FIG. 1.

More particularly, FIG. 10 illustrates a step of etching second sub-layer 25 from the structure obtained at the end of the steps of FIGS. 3 to 9.

The portions of sub-layer 25 which are not topped with layer 39 are removed by etching.

The second etching is performed in a bath, made of approximately 50% (volumetric) of hydrogen fluoride and 50% of hydrochloric acid.

The temperature of the bath of the second etching is substantially identical to the temperature of the bath of the first etching.

The second etching has a duration in the range from one minute to two minutes, preferably in the range from one minute and fifteen seconds to one minute and forty seconds. The duration of the second etching is more preferably equal to approximately one minute and thirty seconds, more preferably still equal to one minute and thirty seconds.

During this step, layer 39 is also etched across its entire thickness. At the end of the step illustrated in FIG. 10, the structure no longer comprises layer 39.

It could have been devised to deposit the SIPOS layer and then to etch this same layer before depositing the two glass layers and simultaneously etching them. This would however have the disadvantage of requiring two photolithography steps prior to the etching of the SIPOS due to the depth of steps 17. The depth of steps 17, in the present description, is reduced by the sub-layer 23 which have a partial planarization effect.

An advantage of the described embodiments is that they enable to integrate a SIPOS layer into the structure of a thyristor, which enables to decrease leakage currents.

Another advantage of the described embodiments and implementation modes is that they enable to form devices having continuous SIPOS and glass layers, with no risk of holes, at the level of the angle formed at the top of each step.

Another advantage of the described embodiments is that they enable to do away with a photolithography step and thus, on the one hand, to decrease the manufacturing costs of the considered thyristor and, on the other hand, to gain accuracy for the alignment of the different layers.

Various embodiments and variations have been described. It will be understood by those skilled in the art that certain features of this various embodiments and variations may be combined, and other variations will occur to those skilled in the art. The described embodiments are not limited to the examples of dimensions and of materials mentioned hereabove.

Finally, the practical implementation of the described embodiments and variations is within the abilities of those skilled in the art based on the functional indications given hereabove.

The invention claimed is:

1. A device, comprising:
a semiconductor substrate including a step at a periphery of the semiconductor substrate;
a first layer on top of and in contact with a first surface of the semiconductor substrate and extending at least on and in contact with a wall and bottom of the step, wherein the first layer is made of polysilicon doped with oxygen; and
a second layer extending on and in contact with the first layer and on edges of the first layer, the second layer forming a boss between the step and a central area of the device, wherein the second layer is made of glass;
wherein the second layer comprises a first sub-layer on and in contact with the first layer, the first sub-layer and first layer having an aligned edge, and a second sub-layer extending on and in contact with the first sub-layer, the second sub-layer further extending to cover the aligned edge of the first layer and the first sub-layer, and the second sub-layer still further extending on top of and in contact with the first surface of the semiconductor substrate.

2. The device of claim 1, wherein the first sub-layer has a thickness, at the level of the boss, in a range from 5 μm to 30 μm.

3. The device of claim 1, wherein the first sub-layer has a thickness, at the level of the boss, in a range from 10 μm to 20 μm.

4. The device of claim 1, wherein the first sub-layer has a thickness, at the level of the boss, equal to approximately 13 μm.

5. The device of claim 1, wherein the first sub-layer has a thickness, at the bottom of the step, in a range from 20 μm to 60 μm.

6. The device of claim 1, wherein the first sub-layer has a thickness, at the bottom of the step, in a range from 30 μm to 40 μm.

7. The device of claim 1, wherein the first sub-layer has a thickness, at the bottom of the step, equal to approximately 35 μm.

8. The device of claim 1, wherein the second sub-layer has a thickness in a range from 5 μm to 20 μm.

9. The device of claim 1, wherein the second sub-layer has a thickness equal to approximately 13 μm.

10. The device of claim 1, wherein the first layer has a thickness in a range from 0.2 μm to 1 μm.

11. The device of claim 1, wherein the first layer has a thickness equal to approximately 0.5 μm.

12. The device of claim 1, wherein the boss has a thickness in a range from 10 μm to 50 μm.

13. The device of claim 1, wherein the boss has a thickness in a range from 10 μm to 35 μm.

14. The device of claim 1, wherein the boss has a thickness equal to approximately 15 μm.

15. The device of claim 1, wherein the step has a depth in a range from 80 μm to 200 μm.

16. The device of claim 1, wherein the step has a depth equal to approximately 105 μm.

17. An electronic component comprising the device of claim 1 wherein the step, first layer and second layer are present on each surface of the semiconductor substrate to form a circuit component selected from the group consisting of: a thyristor, a triac and a transient-voltage-suppression diode.

18. A device, comprising:
a semiconductor substrate including an upper surface and a step surface;
a first layer made of polysilicon doped with oxygen, the first layer extending on and in contact with the step surface and on and in contact with a first portion of the upper surface, wherein the layer further includes a first lateral edge at the upper surface;
a second layer made of glass, the second layer extending on and in contact with the first layer, wherein the second layer further includes a second lateral edge aligned with the first lateral edge; and
a third layer made of glass, the third layer extending on and in contact with the second layer, wherein the third layer further extends on and in contact with the first and second lateral edges, and wherein the third layer still further extends on and in contact with a second portion of the upper surface.

19. The device of claim 18, further comprising:
a doped region at the upper surface of the semiconductor substrate adjacent the second portion of the upper surface; and
an electrode on and in contact with the doped region.

20. The device of claim 18, further comprising a stack of layers on a third portion of the upper surface laterally offset from the first and second portions, the stack of layers comprising:
a part of the first layer;

a part of the second layer on and in contact with the part of the first layer; and a part of the third layer on and in contact with a top and lateral edges of the part of the second layer and further extending on and in contact with lateral edges of the part of the first layer.

21. The device of claim 20, further comprising:

a doped region at the upper surface of the semiconductor substrate between the third layer and the part of the third layer; and an electrode on and in contact with the doped region.

22. The device of claim 18 forming a circuit component selected from the group consisting of: a thyristor, a triac and a transient-voltage-suppression diode.

23. The device of claim 18, wherein the second layer has a thickness, at the level of the boss, in a range from 5 μm to 30 μm.

24. The device of claim 18, wherein the second layer has a thickness, at the level of the boss, in a range from 10 μm to 20 μm.

25. The device of claim 18, wherein the second layer has a thickness, at the level of the boss, equal to approximately 13 μm.

26. The device of claim 18, wherein the second layer has a thickness, at the bottom of the step, in a range from 20 μm to 60 μm.

27. The device of claim 18, wherein the second layer has a thickness, at the bottom of the step, in a range from 30 μm to 40 μm.

28. The device of claim 18, wherein the second layer has a thickness, at the bottom of the step, equal to approximately 35 μm.

29. The device of claim 18, wherein the third layer has a thickness in a range from 5 μm to 20 μm.

30. The device of claim 18, wherein the third layer has a thickness equal to approximately 13 μm.

31. The device of claim 18, wherein the first layer doped with oxygen has a thickness in a range from 0.2 μm to 1 μm.

32. The device of claim 18, wherein the first layer doped with oxygen has a thickness equal to approximately 0.5 μm.

* * * * *